(12) United States Patent (10) Patent No.: US 12,571,859 B2

Hirai et al. (45) Date of Patent: Mar. 10, 2026

(54) THERMAL-INSULATION CONTAINER AND MAGNETOSPINOGRAPH USING SAME

(71) Applicant: Arisawa MFG. Co., Ltd., Niigata (JP)

(72) Inventors: Masaaki Hirai, Niigata (JP); Toshio Nakamura, Niigata (JP)

(73) Assignee: Arisawa MFG. Co., Ltd. (JP)

( * ) Notice: Subject to any disclaimer, the term of this patent is extended or adjusted under 35 U.S.C. 154(b) by 163 days.

(21) Appl. No.: 18/552,474

(22) PCT Filed: Mar. 14, 2022

(86) PCT No.: PCT/JP2022/011222

§ 371 (c)(1),
(2) Date: Sep. 26, 2023

(87) PCT Pub. No.: WO2022/209811

PCT Pub. Date: Oct. 6, 2022

(65) Prior Publication Data

US 2024/0175944 A1 May 30, 2024

(30) Foreign Application Priority Data

Mar. 31, 2021 (JP) ................................. 2021-059358

(51) Int. Cl.
*G01R 33/00* (2006.01)
*G01R 33/035* (2006.01)

(52) U.S. Cl.
CPC ..... *G01R 33/0047* (2013.01); *G01R 33/0354* (2013.01)

(58) Field of Classification Search
CPC ............ G01R 33/0047; G01R 33/0354; G01R 33/007; A61B 5/05; A61B 5/248; A61B 5/4566
See application file for complete search history.

(56) References Cited

U.S. PATENT DOCUMENTS

2017/0253965 A1* 9/2017 Takada ..................... C09D 7/61
2017/0352457 A1 12/2017 Kubota et al.
(Continued)

FOREIGN PATENT DOCUMENTS

JP S61201994 A * 9/1986 ............. H01L 39/04
JP H057023 A 1/1993
(Continued)

OTHER PUBLICATIONS

Taiwan Patent Office; Office Action dated Apr. 2, 2025, issued for the corresponding TW patent application No. 111110259.
(Continued)

*Primary Examiner* — Akm Zakaria
(74) *Attorney, Agent, or Firm* — MASCHOFF BRENNAN

(57) ABSTRACT

A thermally insulated container (10) includes an inner container (11) and an outer container (14) surrounding the inner container (11) via a void (15). The inner container (11) and the outer container (14) contain a fiber reinforced plastic prepared by impregnating a base material with a resin. The inner container (11) includes a first tubular container (13) and a second tubular container (22) having internal accommodation spaces (23, 24) to reserve a refrigerant (16), and a refrigerant inlet tube (12) for introduction of the refrigerant (16). The accommodation space (24) is in communication with the accommodation space (23). The base materials in predetermined areas of the second tubular container (22) and the outer container (14) contain woven fabrics and unidirectional fiber sheets. The outer container (14) surrounds the second tubular container (22) such that the unidirectional fiber sheets in the respective predetermined areas are opposed to each other.

12 Claims, 9 Drawing Sheets

(56)        References Cited

U.S. PATENT DOCUMENTS

2018/0092561 A1      4/2018  Kawabata et al.
2024/0224413 A1 *   7/2024  Urashima ............ H05K 1/0233

FOREIGN PATENT DOCUMENTS

| | | | | |
|---|---|---|---|---|
| JP | H0541546 | A | 2/1993 | |
| JP | H07302933 | A  * 11/1995 | ............ H01L 39/04 | |
| JP | 2001-269323 | A | 10/2001 | |
| JP | 2010035596 | A | 2/2010 | |
| JP | 2014000805 | A | 1/2014 | |
| JP | 2017217457 | A | 12/2017 | |
| JP | 2018057843 | A | 4/2018 | |

OTHER PUBLICATIONS

International Search Report and Written Opinion of the International Searching Authority for International Application No. PCT/JP2022/011222, mailed May 24, 2022. (translation included).
Extended European Search Report (EESR) dated Sep. 18, 2024, issued for the corresponding EP patent application No. 22780032.3.

* cited by examiner

10

UP

DOWN

B－B

UP

DOWN

CL

THERMAL-INSULATION CONTAINER AND MAGNETOSPINOGRAPH USING SAME

CROSS REFERENCE TO RELATED APPLICATIONS

This application is a national phase of International Patent Application No. PCT/JP2022/011222, filed Mar. 14, 2022; which claims priority to Japanese Patent Application No. 2021-059358, filed Mar. 31, 2021; all of which are incorporated by reference herein in their entirety.

TECHNICAL FIELD

The present disclosure relates to a thermally insulated container and a magnetospinograph including the same.

BACKGROUND ART

In the medical field, a magnetospinograph, which is an apparatus for measuring magnetic fields generated in response to neural activities in a spinal cord, has been developed. Such a magnetospinograph measures weak magnetic fields generated in the spinal cord with a superconducting quantum interference device (hereinafter referred to as "SQUID") using the Josephson effect.

The measurement at the SQUID is based on the principle of superconducting property. In order to achieve a superconducting state, the SQUID is required to be immersed in a refrigerant, such as liquid helium, at a temperature of −269° C. (4.2 K). The magnetospinograph thus demands an excellent thermally insulated container capable of reserving the refrigerant. This thermally insulated container needs to contain non-magnetic materials unsusceptible to magnetic force.

For example, Patent Literature 1 discloses an extremely low temperature container including an inner container made of a fiber reinforced plastic (hereinafter referred to as "FRP") and an outer container surrounding the inner container, and discloses a magnetic detecting apparatus including this extremely low temperature container. The inner container is filled with a liquid having a low boiling point. A magnetic detecting sensor is installed in this liquid. The void between the inner container and the outer container is in a vacuum state.

CITATION LIST

Patent Literature

Patent Literature 1: Unexamined Japanese Patent Application Publication No. H7-302933

SUMMARY OF INVENTION

Technical Problem

Since the magnetospinograph measures weak magnetic fields, the distance (lift-off) between the SQUID and the measurement target site of a spinal cord must be made as short as possible. In particular, the thermally insulated container located between the SQUID and the measurement target site of the spinal cord is required to include walls having a reduced thickness and have sufficient rigidity so as to resist external stresses and internal and external pressures, while maintaining sufficient thermal insulation performance.

The inner container and the outer container disclosed in Patent Literature 1 include thick walls in order to improve the thermal insulation performance and rigidity. Unfortunately, these thick walls inhibit the SQUID from detecting weak magnetic fields.

An objective of the present disclosure, which has been accomplished in view of the above situations, is to provide a thermally insulated container characterized by thin walls and high rigidity, and a magnetospinograph including the thermally insulated container.

Solution to Problem

In order to achieve the above objective, [1] a thermally insulated container according to a first aspect of the present disclosure includes an inner container and an outer container surrounding the inner container via a void. Each of the inner container and the outer container is made of a fiber reinforced plastic prepared by impregnating a base material including fibers with a resin. The inner container includes a first tubular container and a second tubular container each having an internal accommodation space to reserve a refrigerant, and a refrigerant inlet tube through which the refrigerant is introduced into the first tubular container. The accommodation space of the second tubular container is in communication with the accommodation space of the first tubular container. The base material in each of a predetermined area of the second tubular container and a predetermined area of the outer container contains a woven fabric and a unidirectional fiber sheet fabricated by aligning multiple fibers to one direction. The outer container surrounds the second tubular container such that the unidirectional fiber sheet in the predetermined area of the second tubular container is opposed to the unidirectional fiber sheet in the predetermined area of the outer container.

[2] The direction of the fibers of the unidirectional fiber sheet in the predetermined area of the second tubular container may be orthogonal to the direction of extension of a central axis of the second tubular container.

[3] The direction of the fibers of the unidirectional fiber sheet in the predetermined area of the outer container may be parallel to the direction of extension of the central axis of the second tubular container.

[4] Each of the woven fabric and the unidirectional fiber sheet in the predetermined area of the second tubular container may contain at least one selected from the group consisting of glass fibers, alumina fibers, and carbon fibers.

[5] Each of the woven fabric and the unidirectional fiber sheet in the predetermined area of the outer container may contain at least one selected from the group consisting of glass fibers, alumina fibers, and carbon fibers.

[6] The fiber reinforced plastic in the thermally insulated container may have a resin amount of 15 to 50 wt % with respect to the total weight of the fiber reinforced plastic.

[7] The resin may contain an epoxy resin.

[8] A magnetospinograph including a thermally insulated container according to a second aspect of the present disclosure includes a superconducting quantum interference device to detect magnetic fields generated from a living body, and the thermally insulated container according to any one of the above-described [1] to [7]. The superconducting quantum interference device is accommodated in the accommodation space of the second tubular container while being immersed in the refrigerant reserved in the accommodation space.

[9] A measurement surface of the superconducting quantum interference device may be opposed to the predetermined area of the outer container and the predetermined area of the second tubular container.

Advantageous Effects of Invention

The present disclosure can provide a thermally insulated container characterized by thin walls and high rigidity, and a magnetospinograph including the thermally insulated container.

DESCRIPTION OF EMBODIMENTS

A thermally insulated container and a magnetospinograph including the thermally insulated container according to an embodiment of the present disclosure (hereinafter also referred to as "embodiment") are described in detail below. The embodiment below is a mere example intended to facilitate an understanding of the present disclosure and is not to be construed as limiting the scope of the present disclosure. The present disclosure can be appropriately modified within the gist of the present disclosure.

Embodiment 1

Figure 1:
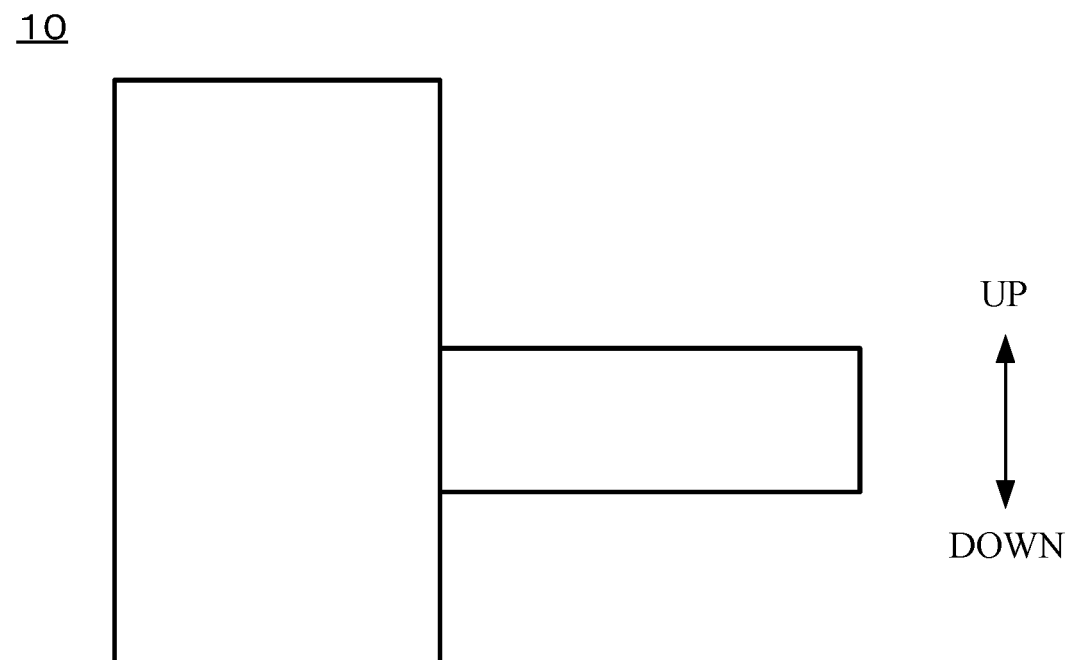
FIG. 1 is a schematic side view of a thermally insulated container according to one embodiment of the present disclosure.
Figure 2:
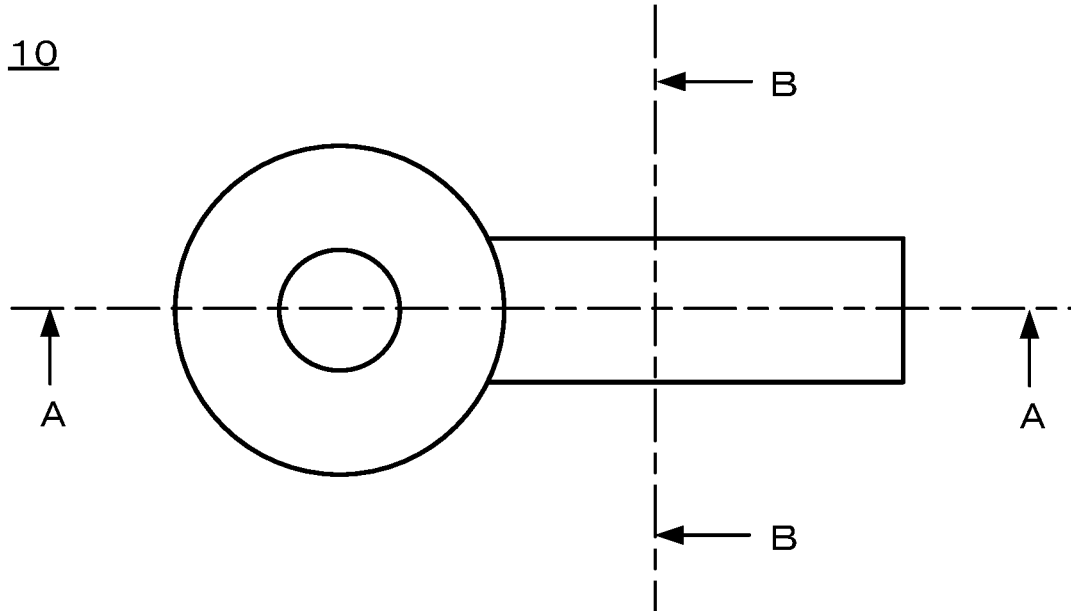
FIG. 2 is a schematic top view of the thermally insulated container according to the embodiment of the present disclosure.
Figure 3:
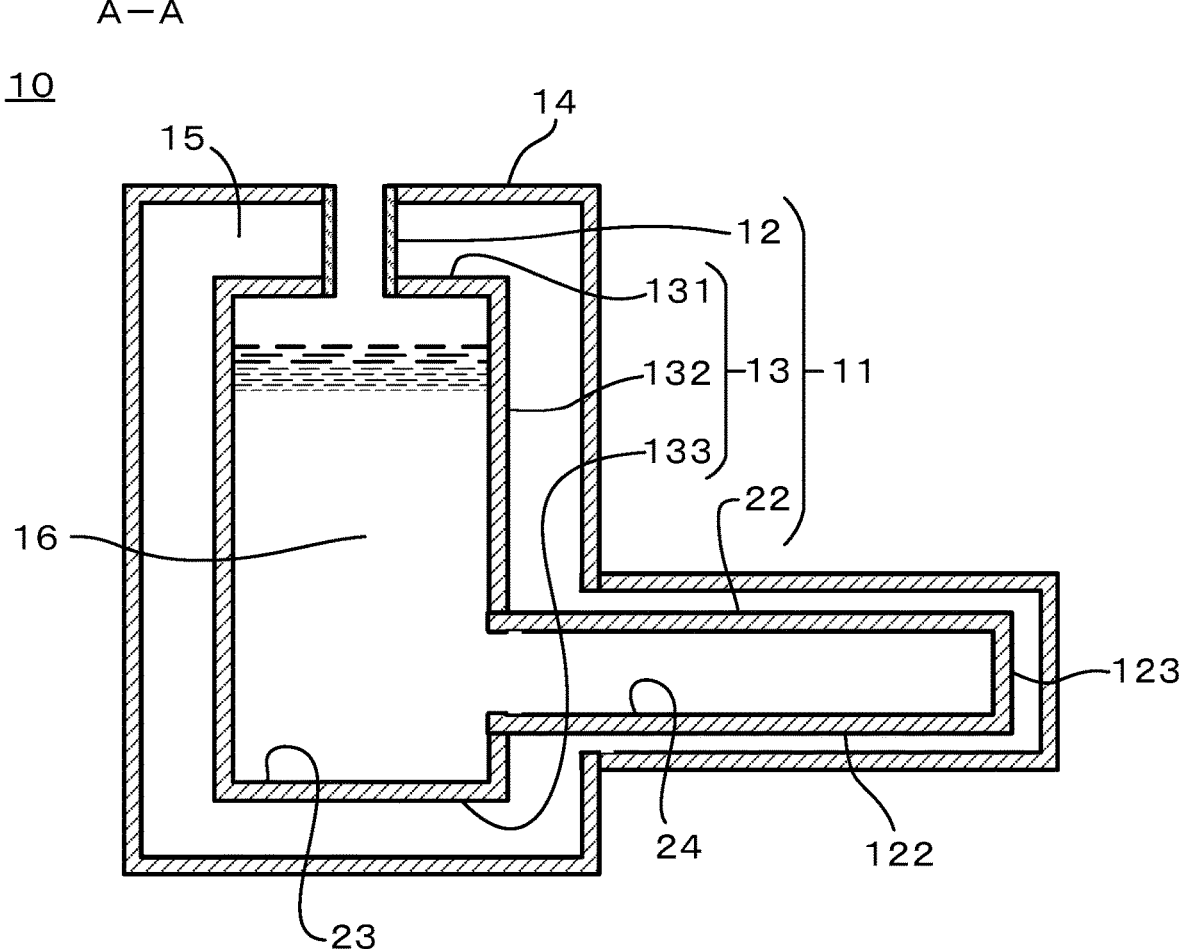
FIG. 3 is a sectional view taken along the line A-A of FIG. 2.

A thermally insulated container 10 according to Embodiment 1 is described below. FIG. 1 illustrates the thermally insulated container 10 when viewed from a side. FIG. 2 illustrates the thermally insulated container 10 when viewed from the top. FIG. 3 is a sectional view of the thermally insulated container 10 taken along the line A-A of FIG. 2. As illustrated in FIG. 3, the thermally insulated container 10 serves to reserve a refrigerant 16. The thermally insulated container 10 includes an inner container 11, and an outer container 14 surrounding the inner container 11 via a void 15.

The description is first directed to the inner container 11 and the outer container 14.
Inner Container 11
The inner container 11 includes a first tubular container 13 including an internal accommodation space 23 for reserving the refrigerant 16, a refrigerant inlet tube 12 fixed to the first tubular container 13, and a second tubular container 22 including an internal accommodation space 24 for reserving the refrigerant 16. The accommodation space 24 is in communication with the accommodation space 23. The first tubular container 13 includes a ceiling segment 131 constituting the upper surface, a tubular segment 132 constituting the side wall, and a bottom segment 133 constituting the bottom surface. The refrigerant inlet tube 12 is fixed to the ceiling segment 131. Alternatively, the refrigerant inlet tube 12 may be fixed to the tubular segment 132. The second tubular container 22 includes a tubular segment 122 constituting the side walls, and a bottom segment 123 covering one end of the tubular segment 122. The "internal" area in the inner container 11 indicates an area defined by the surfaces that are possibly in contact with the refrigerant 16.

The description is then directed to the refrigerant inlet tube 12, the first tubular container 13, and the second tubular container 22.
Refrigerant Inlet Tube 12
The refrigerant inlet tube 12 is a tubular body through which the refrigerant 16 is introduced into the first tubular container 13. Examples of the shape of the tubular body include a circular cylindrical shape, an elliptic cylindrical shape, and a prism shape, although these examples are not to be taken in a limiting sense.

The refrigerant inlet tube 12 has a thickness of 2 to 30 mm, for example, in terms of heat insulating properties, and in terms of achieving sufficient rigidity at ordinary temperatures and in the temperature region of at most −196° C. The "temperature region of at most −196° C." is hereinafter referred to as "extremely low temperature region". The thickness of the refrigerant inlet tube 12 indicates the thickness of a wall of the refrigerant inlet tube 12 in a plane orthogonal to the longitudinal direction (height direction) of the refrigerant inlet tube 12.

The length of the refrigerant inlet tube 12 is appropriately determined depending on the sizes of the outer container 14 and the inner container 11, and is 100 to 500 mm, for example.

In an exemplary case where the refrigerant inlet tube 12 has a circular cylindrical shape, the refrigerant inlet tube 12 has a diameter of 50 to 300 mm, for example, in terms of reducing evaporation of the refrigerant, although this range is not to be taken in a limiting sense.

In an exemplary case where the refrigerant inlet tube 12 has an elliptic cylindrical shape, the major axis has a length of 50 to 300 mm, for example.

In an exemplary case where the refrigerant inlet tube 12 has a prism shape, the diagonal line has a length of 100 to 400 mm in a section of the tubular body in a plane orthogonal to the longitudinal direction (height direction) of the refrigerant inlet tube 12, for example.

The refrigerant inlet tube 12 is made of a fiber reinforced plastic (hereinafter referred to as "FRP") fabricated by impregnating a base material with a resin.

The resin in the FRP is in the stage after completion of a curing reaction (hereinafter referred to as "in the C-stage"). In the following description, the state of curing of the FRP is the C-stage, unless otherwise stated. The same holds true for the other embodiments.

Figure 5:
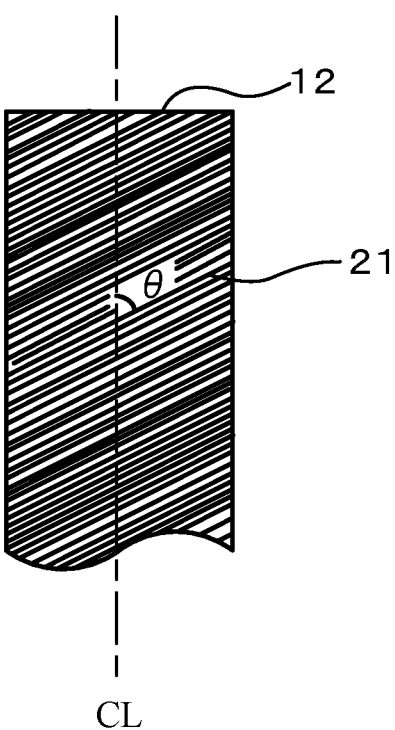
FIG. 5 is a schematic diagram illustrating fibers of a fiber reinforced plastic in a refrigerant inlet tube that are wound in a helix.

As illustrated in FIG. 5, a base material 21 of the FRP in the refrigerant inlet tube 12 is wound in a helix around the direction of extension of the central axis CL of the refrigerant inlet tube 12 and thus defines a cylindrical shape, in order to delay heat conduction from the outside via the refrigerant inlet tube 12 to the first tubular container 13. Specifically, the base material 21 is wound in a helix such that the fibers in the base material 21 are inclined at an angle θ of 50° to 89° from the direction of extension of the central axis CL of the refrigerant inlet tube 12. More preferably, the angle θ is 55° to 70°, in terms of thermal conductivity and rigidity of the refrigerant inlet tube 12.

The base material 21 contains at least one selected from the group consisting of glass fibers, alumina fibers, and carbon fibers. The base material 21 preferably contains glass fibers, in terms of costs, processability, and availability of materials, and in terms of reducing the thermal conductivity in the range of the ordinary temperatures to the extremely low temperature region.

Examples of the resin to be impregnated in the base material 21 include epoxy resin compositions mainly made of an epoxy resin, phenol resin compositions mainly made of a phenol resin, and polyimide resin compositions mainly made of a thermosetting polyimide resin, although these examples are not to be taken in a limiting sense.

An amount of the resin (solid content basis) to be impregnated in the base material 21 is preferably 15 to 50 wt % with respect to the total weight of the FRP in the refrigerant inlet tube 12, in terms of reducing heat conduction to the first tubular container 13.

An amount of the resin to be impregnated in the base material, such as fibers, can be represented in the unit of part by weight or resin amount (wt %). The part by weight indicates a weight of the resin on the assumption that the weight of the base material is equal to 100 parts by weight. The resin amount (wt %) indicates a ratio of the weight of the resin adhering to the base material (fibers) to the total weight of the base material and the resin, and is calculated by the following expression: [resin amount (wt %)]=[weight of resin (wt)×100]/[weight of fibers (wt)+weight of resin (wt)]. The amounts of the resin are all expressed in the solid content basis, unless otherwise specified. An amount of the resin on the solid content basis indicates an amount of the resin except for volatile contents, such as solvent, for example.

The refrigerant inlet tube 12 can be fabricated by a filament winding method, for example. The method of fabricating the refrigerant inlet tube 12 is described below.

First Tubular Container 13

The first tubular container 13 has a bottom and defines the internal accommodation space 23 for reserving the refrigerant 16. The accommodation space 23 is defined inside the first tubular container 13. Examples of the shape of the tubular segment 132 of the first tubular container 13 include a circular cylindrical shape, an elliptic cylindrical shape, and a prism shape, although these examples are not to be taken in a limiting sense.

The wall of the first tubular container 13 has a thickness of 2 to 30 mm, in terms of heat insulating properties and in terms of achieving sufficient rigidity in the extremely low temperature region. The thickness of the wall of the first tubular container 13 indicates a thickness of the tubular segment 132, that is, a thickness of the wall of the first tubular container 13 (tubular segment 132) in a plane orthogonal to the longitudinal direction (height direction) of the first tubular container 13 (tubular segment 132).

In an exemplary case where the first tubular container 13 is applied to an apparatus for measuring magnetic fields in a human body, the first tubular container 13 preferably has a sufficient size to reserve 50 to 150 L of refrigerant in terms of extending the operating period of the apparatus, although this range is not to be taken in a limiting sense.

The tubular segment 132 contains an FRP fabricated by impregnating a base material with a resin. Examples of the base material of the FRP include fibers, woven fabrics, and unidirectional fiber sheets fabricated by aligning multiple fibers to one direction. The base material in the FRP is preferably fibers or unidirectional fiber sheets, in order to delay heat conduction from the outside via the refrigerant inlet tube 12 to the first tubular container 13. The base material in the FRP may be a combination of two or more types of base materials, and preferably be a combination of fibers and unidirectional fiber sheets.

In the case where the base material is fibers, the fibers are at least one selected from the group consisting of glass fibers, alumina fibers, and carbon fibers. The fibers are preferably alumina fibers, in terms of reducing thermal conductivity in the extremely low temperature region. The fibers in the FRP may be a combination of two types of fibers. For example, the fibers in the FRP may be a combination of alumina fibers and glass fibers. The fibers in the FRP in the tubular segment 132 are wound in a helix around the direction of extension of the central axis of the tubular segment 132, although this example is not to be taken in a limiting sense. The angle of the wound fibers is 50° to 89° relative to the direction of extension of the central axis of the tubular segment 132, for example.

In the case where the base material is woven fabrics, the woven fabrics are fabricated by weaving the above-mentioned fibers. Examples of the weaving method include sateen, plain, and twill weaves. The woven fabrics are stacked on each other to define a tubular shape. For example, the woven fabrics are stacked such that the warps are inclined at +45° and the wefts are inclined at −45° from the direction of extension of the central axis of the tubular segment 132. Alternatively, the woven fabrics may be stacked such that the warps are inclined at 0° and the wefts are inclined at 90°. In terms of achieving quasi-isotropic rigidity, the stacking process may involve first disposing one woven fabric such that the warps are inclined at +45° and the wefts are inclined at −45° from the direction of extension of the central axis of the tubular segment 132, then stacking another woven fabric thereon such that the warps are inclined at 0° and the wefts are inclined at 90°, and repeating these steps.

Figure 6:
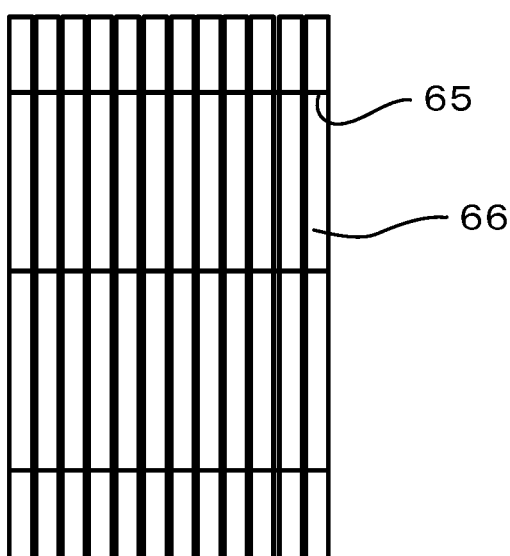
FIG. 6 is a schematic diagram illustrating flat yarns in a unidirectional fiber sheet that are fixed by holding yarns.
Figure 7:
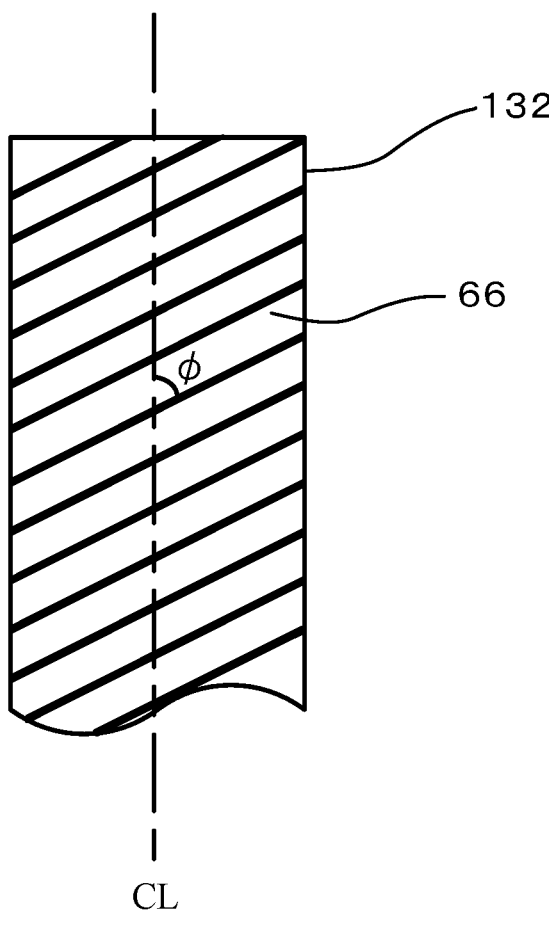
FIG. 7 is a schematic diagram illustrating a unidirectional fiber sheet wound in a helix in a tubular segment of a first tubular container.

In the case where the base material is unidirectional fiber sheets, each of the unidirectional fiber sheets is fabricated by aligning the above-mentioned fibers to one direction. FIG. 6 is a schematic diagram when the unidirectional fiber sheets are viewed from the front. Each of the unidirectional fiber sheets is fabricated by aligning multiple flat yarns 66 to one direction, as illustrated in FIG. 6. The unidirectional fiber sheet may also contain holding yarns 65 that retain the aligned flat yarns 66 and thus prevent the flat yarns 66 from being disarranged. The unidirectional fiber sheets are wound in a helix around the direction of extension of the central axis of the tubular segment 132 and define a tubular shape. As illustrated in FIG. 7, the unidirectional fiber sheets are wound in a helix such that the fibers of the flat yarns 66 form an angle φ of 50° to 89° from the direction of extension of the central axis CL of the tubular segment 132, for example.

Examples of the resin to be impregnated in the base material in the tubular segment 132 include epoxy resin compositions mainly made of an epoxy resin, phenol resin compositions mainly made of a phenol resin, and polyimide resin compositions mainly made of a thermosetting polyimide resin, although these examples are not to be taken in a limiting sense. The resin is preferably an epoxy resin composition, in terms of ensuring rigidity and toughness in a range of the ordinary temperature to the extremely low temperature region, and in terms of ensuring good process-ability. The resin may also be a mixture of two or more types of resin compositions.

The resin amount (solid content basis) of the tubular segment 132 is preferably 15 to 50 wt % with respect to the total weight of the FRP in the tubular segment 132, in terms of maintaining the rigidity of the tubular segment 132 during reservation of the refrigerant at a temperature of at most −196° C.

The ceiling segment 131 and the bottom segment 133 of the first tubular container 13 contain an FRP fabricated by impregnating a base material with a resin. The base material contains a stack of multiple woven fabrics. The resin is preferably identical to the resin in the tubular segment 132 and the refrigerant inlet tube 12, in terms of making the expansion/contraction behaviors of the first tubular container 13 and the refrigerant inlet tube 12 equal to the expansion/contraction behaviors of the ceiling segment 131 and the bottom segment 133 in a range of the ordinary temperature to the extremely low temperature region. The resin amount (solid content basis) of the FRP in the ceiling segment 131 and the resin amount (solid content basis) of the FRP in the bottom segment 133 are 15 to 50 wt % with respect to the total weight. The ceiling segment 131 and the bottom segment 133 have a thickness identical to the thickness of the tubular segment 132.

Examples of the refrigerant 16 to be reserved in the first tubular container 13 and the second tubular container 22 include liquid oxygen, liquid nitrogen, and liquid helium, although these examples are not to be taken in a limiting sense. The refrigerant 16 is preferably liquid helium for use in the extremely low temperature region for measurement of magnetic fields of a spinal cord.

The method of fabricating the first tubular container 13 is described below.

Second Tubular Container 22

The second tubular container 22 includes the tubular segment 122 constituting the side walls, and the bottom segment 123 covering one end of the tubular segment 122. The accommodation space 24 is defined inside the second tubular container 22. The accommodation space 24 is in communication with the accommodation space 23 of the first tubular container 13. The second tubular container 22 is fixed to the first tubular container 13 (tubular segment 132).

The second tubular container 22 is fixed to the tubular segment 132 such that the longitudinal direction of the second tubular container 22 is orthogonal to the vertical direction. The second tubular container 22 may be fixed by an exemplary joining method described below, although this example is not to be taken in a limiting sense.

Examples of the shape of the second tubular container 22 include a circular cylindrical shape, an elliptic cylindrical shape, and a prism shape, although these examples are not to be taken in a limiting sense. The examples of the prism shape include a shape of column of which a section of the second tubular container 22 is a square, trapezoid, or rectangle in a plane orthogonal to the longitudinal direction of the second tubular container 22.

The second tubular container 22 has a thickness of 2 to 15 mm, for example, in terms of heat insulating properties and in terms of achieving sufficient rigidity in the extremely low temperature region, although this range is not to be taken in a limiting sense. The second tubular container 22 may have the same thickness as the first tubular container 13 in accordance with the usage. The thickness of the second tubular container 22 indicates a thickness of the wall of the tubular segment 122 included in the second tubular container 22.

In an exemplary case where the second tubular container 22 is applied to an apparatus for measuring magnetic fields of a spinal cord, the second tubular container 22 preferably has a sufficient size to reserve 10 to 30 L of the refrigerant within the second tubular container 22 alone, although this range is not to be taken in a limiting sense.

The description of the second tubular container 22 is then directed the tubular segment 122 and the bottom segment 123 included in the second tubular container 22, separately.

The tubular segment 122 is made of an FRP fabricated by impregnating a base material with a resin. The base material in a predetermined area of the tubular segment 122 contains woven fabrics and unidirectional fiber sheets. The "predetermined area of the tubular segment 122" is described below.

The woven fabrics in the predetermined area of the tubular segment 122 are fabricated by weaving at least one selected from the group consisting of glass fibers, alumina fibers, and carbon fibers. The fibers in the woven fabrics are preferably glass fibers and alumina fibers, in terms of ensuring rigidity and processability. The fibers in the woven fabrics may be a combination of two types of fibers. Examples of the method of weaving fibers to produce the woven fabrics include sateen, plain, and twill weaves. The weaving method is preferably a sateen weave in terms of readiness of formation.

The unidirectional fiber sheets in the predetermined area of the tubular segment 122 are made of at least one selected from the group consisting of glass fibers, alumina fibers, and carbon fibers. The fibers in the unidirectional fiber sheets are preferably glass fibers and alumina fibers, in terms of ensuring rigidity and processability. The fibers in the uni-directional fiber sheets may be a combination of two types of fibers.

The woven fabrics and the unidirectional fiber sheets in the predetermined area of the tubular segment 122 are stacked on each other to define a part of the tubular shape around the central axis of the tubular segment 122, for example. In a sectional view of the wall of the tubular segment 122 taken along a plane orthogonal to the longitudinal direction of the tubular segment 122, the woven fabrics and the unidirectional fiber sheets have a structure in which woven fabrics are stacked on both surfaces of a unidirectional fiber sheet, a structure in which unidirectional fiber sheets are stacked on both surfaces of a woven fabric, or a structure in which woven fabrics and unidirectional fiber sheets are alternately stacked on each other. The woven fabrics and the unidirectional fiber sheets preferably have a stacking structure symmetrical about the woven fabric or the unidirectional fiber sheet located at the center in the thickness direction in a sectional view of the wall of the tubular segment 122, for example, a structure in which woven fabrics are stacked on both surfaces of the central unidirectional fiber sheet, in terms of enhancing the rigidity.

The fibers of the stacked unidirectional fiber sheets are arranged to be orthogonal to (inclined at 90° from) the direction of extension of the central axis of the tubular segment 122. The range of inclination of the fibers of the unidirectional fiber sheets from the direction of extension of the central axis of the tubular segment 122 is 90°±15°, in terms of ensuring sufficient rigidity of the tubular segment 122.

In another base material in the FRP in the tubular segment 122, a unidirectional fiber sheet, of which the fibers are inclined at 90° from the direction of extension of the central axis of the tubular segment 122, may be disposed between the stacked woven fabrics. In this structure, the woven fabrics may be stacked such that the warps are inclined at +45° and the wefts are inclined at –45° from the direction of extension of the central axis of the tubular segment 122, for example. Alternatively, the woven fabrics may be stacked such that the warps are inclined at 0° and the wefts are inclined at 90°. In terms of achieving quasi-isotropic rigidity, the stacking process may involve first disposing one woven fabric such that the warps are inclined at +45° and the wefts are inclined at –45° from the direction of extension of the central axis of the tubular segment 122, stacking a unidirectional fiber sheet thereon, and then stacking another woven fabric thereon such that the warps are inclined at 0° and the wefts are inclined at 90°.

Figure 4:
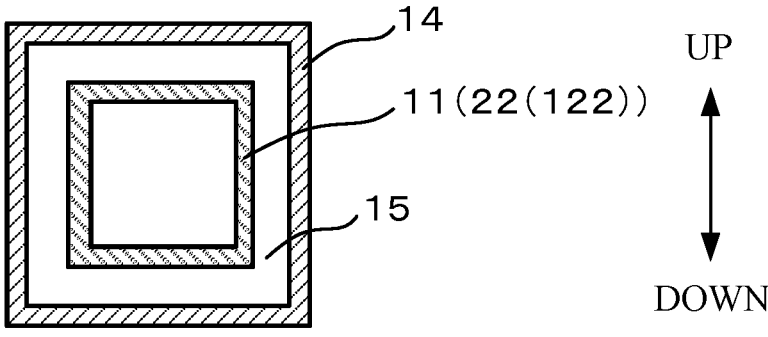
FIG. 4 is a sectional view taken along the line B-B of FIG. 2.

FIG. 4 is a sectional view of the thermally insulated container 10 illustrated in FIG. 2 taken along the line B-B. The up-down direction illustrated in FIG. 4 corresponds to the up-down direction illustrated in FIG. 1. The inner container 11 (tubular segment 122 of the second tubular container 22) is surrounded by the outer container 14 via the void 15. The "predetermined area of the tubular segment 122" is described below focusing on an exemplary tubular segment 122 having a prism shape having a rectangular section illustrated in FIG. 4. The predetermined area of the tubular segment 122 indicates a partial area of one surface (upper surface) of the tubular segment 122, or the whole area of the one surface (upper surface) of the tubular segment 122. In an exemplary case where the thermally insulated container 10 is applied to a magnetospinograph, this predetermined area of the tubular segment 122 encompasses the area opposed to the measurement surface of the superconducting quantum interference device.

The base material in the predetermined area of the tubular segment 122 contains both of the woven fabrics and the unidirectional fiber sheets and has the above-described stacking structure, so that the predetermined area has high rigidity. The predetermined area of the tubular segment 122 containing both of the woven fabrics and the unidirectional fiber sheets as a base material has higher rigidity than the predetermined area of a tubular segment 122 containing woven fabrics alone as a base material. That is, a structure containing both of woven fabrics and unidirectional fiber sheets can achieve the same rigidity as the rigidity achievable by a structure containing woven fabrics alone, despite of thinner walls than the structure containing woven fabrics alone. In the case where the predetermined area containing both of the woven fabrics and the unidirectional fiber sheets as a base material corresponds to the whole area of the one surface (upper surface) of the tubular segment 122, the predetermined area has still higher rigidity, because of the higher ratio of the predetermined area containing the woven fabrics and the unidirectional fiber sheets than the ratio in the case of the predetermined area corresponding to a partial area.

In an exemplary case where the tubular segment 122 has a circular cylindrical shape, the predetermined area of the tubular segment 122 corresponds to a partial area of the peripheral surface (curved surface) of the semicylinder constituting the half of the circular cylindrical shape, or the whole area of the peripheral surface (curved surface) of the semicylinder.

The areas of the tubular segment 122 other than the above-described predetermined area may have the same structure as the predetermined area of the tubular segment 122 or a different structure. In the case of a different structure, examples of the base material in the FRP in the areas other than the predetermined area include fibers, woven fabrics, and unidirectional fiber sheets. In the case where the base material is woven fabrics, the woven fabrics are stacked on each other. In the case where the base material is woven fabrics and unidirectional fiber sheets, the base material has a structure in which woven fabrics are stacked on both surfaces of a unidirectional fiber sheet, a structure in which unidirectional fiber sheets are stacked on both surfaces of a woven fabric, or a structure in which woven fabrics and unidirectional fiber sheets are alternately stacked on each other, for example.

The resin amount (solid content basis) of the tubular segment 122 is 15 to 50 wt % with respect to the total weight of the FRP in the tubular segment 122, in terms of maintaining the rigidity.

Examples of the resin to be impregnated in the base material in the tubular segment 122 include epoxy resin compositions mainly made of an epoxy resin, phenol resin compositions mainly made of a phenol resin, and polyimide resin compositions mainly made of a thermosetting polyimide resin, although these examples are not to be taken in a limiting sense. The resin is preferably an epoxy resin composition, in terms of ensuring rigidity and toughness in a range of the ordinary temperature to the extremely low temperature region, and in terms of ensuring good processability. The resin may be a mixture of two or more types of resin compositions.

The description is then directed to the bottom segment 123. The bottom segment 123 contains an FRP. The base material in the FRP is woven fabrics, specifically, a stack of multiple woven fabrics. The resin in the FRP is preferably identical to the resin in the tubular segment 122, in terms of making the expansion/contraction behavior of the tubular segment 122 equal to the expansion/contraction behavior of the bottom segment 123 in a range of the ordinary temperature to the extremely low temperature region. The resin amount (solid content basis) of the bottom segment 123 is preferably 15 to 50 wt % with respect to the total weight of the FRP in the bottom segment 123, like the resin amount of the tubular segment 122, in terms of maintaining the rigidity.

The accommodation space 23 of the first tubular container 13 may be fixed to the accommodation space 24 of the second tubular container 22 such that the accommodation space 23 is in communication with the accommodation space 24 via a member, such as tube, for example. In this case, the member for communication between the accommodation space 23 and the accommodation space 24 is preferably made of the same material as the material of the first tubular container 13 and the second tubular container 22.

The method of fabricating the second tubular container 22 is described below.

The description is then directed to a joining method between the first tubular container 13 and the second tubular container 22. Examples of the joining method include a method of applying an adhesive to the joint surface of the first tubular container 13 and the joint surface of the second tubular container 22 and thereby bonding the joint surfaces to each other, and a method of providing threads to the joint surface of the first tubular container 13 and the joint surface of the second tubular container 22, applying an adhesive to these threads, and then screwing the threads together, although these examples are not to be taken in a limiting sense. These joining methods can also be applied to bonding between the first tubular container 13 and the refrigerant inlet tube 12, for example. The joining method is preferably capable of maintaining the void 15 in a vacuum state.

The applied adhesive is preferably the same resin as the resin in the refrigerant inlet tube 12 and the first tubular container 13, in terms of ensuring good adhesion properties. Examples of the resin include epoxy resin compositions mainly made of an epoxy resin, phenol resin compositions mainly made of a phenol resin, and polyimide resin compositions mainly made of a thermosetting polyimide resin. The resin is preferably an epoxy resin composition, in terms of ensuring rigidity and toughness in a range of the ordinary temperature to the extremely low temperature region, and in terms of ensuring good adhesion properties. The resin may be a mixture of two or more types of resin compositions.

Outer Container 14

As illustrated in FIG. 3, the outer container 14 surrounds the inner container 11 via the void 15. The outer container 14 supports the first tubular container 13 at the ceiling segment of the outer container 14 via the refrigerant inlet tube 12. In the thermally insulated container 10, the end face of the refrigerant inlet tube 12 is flush with the surface of the ceiling segment of the outer container 14.

The state of "surrounding" indicates that the outer container 14 is disposed around the inner container 11 via the void 15 in an encompassing manner.

The void 15 is preferably in a vacuum state in terms of improving the heat insulation performance. The outer container 14 has sufficient rigidity to maintain the shape of the outer container 14, despite of the vacuum state of the void 15. The description is then directed to the structure of the outer container 14.

The portion of the outer container 14 constituting the upper surface is referred to as "ceiling segment". The "internal" area in the outer container 14 indicates an area of the outer container 14 in contact with the void 15.

The outer container 14 has any shape and any size provided that the outer container 14 can surround the inner container 11. The outer container 14 preferably has a rounded shape capable of distributing stresses, in terms of avoiding deformation of the container when the void 15 is evacuated. In particular, the corners of the outer container 14 preferably have a shape having a large radius of curvature. This structure can prevent contraction stresses caused by evacuation from being focused on a specific site of the container.

The walls of the outer container 14 preferably have a thickness equal to or larger than the thickness of the first tubular container 13 and the second tubular container 22, in terms of preventing the container from being deformed in response to evacuation of the void 15. The walls have a thickness of 2 to 30 mm, for example.

The description is then directed to an FRP in the outer container 14. The outer container 14 contains an FRP fabricated by impregnating a base material with a resin.

The base material in the predetermined area of the outer container 14 contains woven fabrics and unidirectional fiber sheets.

The woven fabrics in the predetermined area of the outer container 14 are fabricated by weaving at least one selected from the group consisting of glass fibers, alumina fibers, and carbon fibers. The woven fabrics may be made of a combination of two types of fibers. The fibers in the woven fabrics are preferably glass fibers or alumina fibers, in terms of ensuring rigidity and processability. Examples of the method of weaving fibers to produce the woven fabrics include sateen, plain, and twill weaves. The weaving method is preferably a sateen weave, in terms of ease of shaping.

The unidirectional fiber sheets in the predetermined area of the outer container 14 are fabricated by aligning at least one selected from the group consisting of glass fibers, alumina fibers, and carbon fibers, to one direction. The unidirectional fiber sheets may be made of a combination of two types of fibers. The fibers in the unidirectional fiber sheets are preferably glass fibers or alumina fibers, in terms of ensuring rigidity and processability.

The woven fabrics and the unidirectional fiber sheets in the predetermined area of the outer container 14 are stacked on each other so as to surround the inner container 11 via the void 15. In a sectional view of the wall of the predetermined area of the outer container 14, the woven fabrics and the unidirectional fiber sheets have a structure in which woven fabrics are stacked on both surfaces of a unidirectional fiber sheet, a structure in which unidirectional fiber sheets are stacked on both surfaces of a woven fabric, or a structure in which woven fabrics and unidirectional fiber sheets are alternately stacked on each other. The woven fabrics and the unidirectional fiber sheets preferably have a structure symmetrical about the woven fabric or the unidirectional fiber sheet located at the center in the thickness direction of the wall of the predetermined area of the outer container 14, for example, a structure in which woven fabrics are stacked on both surfaces of the central unidirectional fiber sheet, in terms of enhancing the rigidity.

The fibers of the unidirectional fiber sheets in the predetermined area of the outer container 14 are arranged to be parallel to (inclined at 0° from) the direction of extension of the central axis of the second tubular container 22 (tubular segment 122) surrounded by the outer container 14, in terms of maintaining the rigidity when the thermally insulated container 10 is applied to a magnetospinograph. The range of inclination of the fibers of the unidirectional fiber sheets is preferably 0°±10° from the direction of extension of the central axis of the second tubular container 22 (tubular segment 122), in terms of maintaining sufficient rigidity of the outer container 14.

The woven fabrics in the predetermined area of the outer container 14 are stacked on each other such that the warps are inclined at 0° and the wefts are inclined at 90° from the direction of extension of the central axis of the second tubular container 22 (tubular segment 122) surrounded by the outer container 14. The woven fabrics may also be stacked such that the warps are inclined at +45° and the wefts are inclined at −45°. In terms of achieving quasi-isotropic rigidity, the stacking process may involve first disposing one woven fabric such that the warps are inclined at 0° and the wefts are inclined at 90°, and then stacking another woven fabric thereon such that the warps are inclined at +45° and the wefts are inclined at −45°.

In another structure of the base material in the predetermined area of the outer container 14, a unidirectional fiber sheet may be disposed between the stacked woven fabrics. In this structure, the woven fabrics may be stacked on each other such that the warps are inclined at +45° and the wefts are inclined at −45° from the direction of extension of the central axis of the second tubular container 22 (tubular segment 122) surrounded by the outer container 14. Alternatively, the woven fabrics may be stacked such that the warps are inclined at 0° and the wefts are inclined at 90°. The fibers of the unidirectional fiber sheet are arranged to be inclined at 90° from the direction of extension of the central axis of the surrounded second tubular container 22 (tubular segment 122), in terms of maintaining the rigidity when the thermally insulated container 10 is applied to a magnetospinograph.

The "predetermined area of the outer container 14" is described below focusing on an exemplary outer container 14 having a prism shape having a rectangular section illustrated in FIG. 4. The outer container 14 surrounds the inner container 11 (tubular segment 122 of the second tubular container 22) via the void 15. In the case where the predetermined area of the tubular segment 122 corresponds to the whole area of the upper surface (one surface) of the tubular segment 122, the area of the upper surface of the outer container 14 located thereover is defined as the predetermined area of the outer container 14.

The base material in each of the predetermined area of the outer container 14 and the predetermined area of the inner container 11 (tubular segment 122) contains unidirectional fiber sheets. Furthermore, the outer container 14 surrounds the inner container 11 (tubular segment 122) such that the unidirectional fiber sheets in the tubular segment 122 are opposed to the unidirectional fiber sheets in the outer container 14. This structure can allow the predetermined area of the outer container 14 and the predetermined area of the tubular segment 122 to resist external stresses despite of the vacuum state of the void 15.

The predetermined area of the outer container 14 and the predetermined area of the tubular segment 122 containing both of the woven fabrics and the unidirectional fiber sheets as a base material have higher rigidity than the predetermined area of an outer container 14 and the predetermined area of a tubular segment 122 containing woven fabrics alone as a base material. That is, structures containing both of woven fabrics and unidirectional fiber sheets can achieve the same rigidity as the rigidity achievable by structures containing woven fabrics alone, despite of thinner walls of the tubular segment 122 and the corresponding outer container 14.

The predetermined area of the outer container 14 is preferably larger than the predetermined area of the tubular segment 122. The predetermined area of the outer container 14 can thus have improved rigidity and resist external stresses.

The areas of the outer container 14 other than the above-described predetermined area may have the same structure as the predetermined area of the outer container 14 or a different structure. In the case of a different structure, examples of the base material of the FRP in the areas other than the predetermined area include fibers, woven fabrics, and unidirectional fiber sheets. In the case where the base material is woven fabrics, the woven fabrics are stacked on each other. In the case where the base material is woven fabrics and unidirectional fiber sheets, the base material has a structure in which woven fabrics are stacked on both surfaces of a unidirectional fiber sheet, a structure in which unidirectional fiber sheets are stacked on both surfaces of a woven fabric, or a structure in which woven fabrics and unidirectional fiber sheets are alternately stacked on each other, for example.

Examples of the resin to be impregnated in the base material of the outer container 14 include epoxy resin compositions mainly made of an epoxy resin, phenol resin compositions mainly made of a phenol resin, and polyimide resin compositions mainly made of a thermosetting polyimide resin, although these examples are not to be taken in a limiting sense. The resin to be impregnated in the base material of the outer container 14 is preferably an epoxy resin composition, in terms of ensuring rigidity and toughness in a range of the ordinary temperature to the extremely low temperature region, and in terms of ensuring good processability. The resin may be a mixture of two or more types of resin compositions.

The resin amount (solid content basis) of the outer container 14 is preferably 15 to 50 wt % with respect to the total weight of the FRP in the outer container 14, in terms of maintaining the rigidity of the outer container 14 during reservation of the refrigerant at a temperature of at most −196° C.

The void 15 between the outer container 14 and the first tubular container 13 and the void 15 between the outer container 14 and the second tubular container 22 may be provided with supporting members (not illustrated) to support the first tubular container 13 and the second tubular container 22, in terms of supporting loads and stabilizing the first tubular container 13 and the second tubular container 22 at certain positions.

The method of fabricating the outer container 14 is described below.

The description is then directed to a joining method between the outer container 14 and the refrigerant inlet tube 12. Examples of the joining method include a method of applying an adhesive to the joint surface of the outer container 14 and the joint surface of the refrigerant inlet tube 12 and thereby bonding the joint surfaces to each other, and a method of providing threads to the joint surface of the outer container 14 and the joint surface of the refrigerant inlet tube 12, applying an adhesive to these threads, and then screwing the threads together. These joining methods can also be applied to bonding of members included in the outer container 14 to each other, for example.

Figure 8:
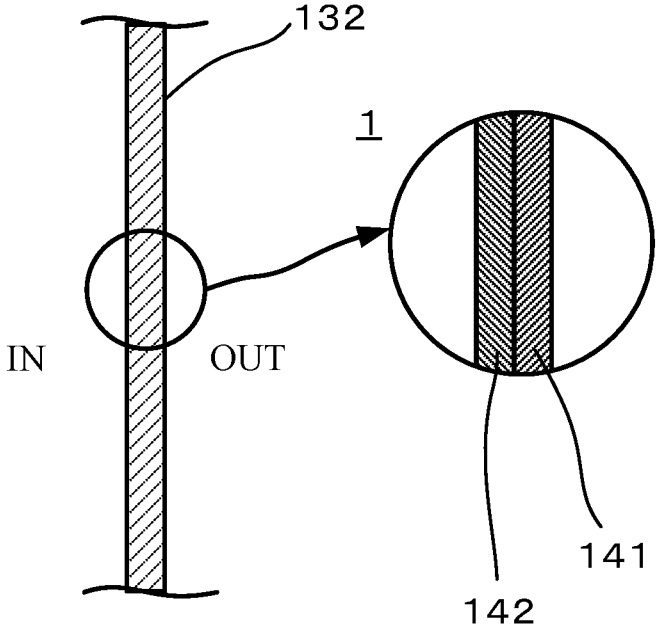
FIG. 8 is a schematic sectional view of a wall of a tubular segment having double-wall structure.

In another example of the first tubular container 13, the wall of the tubular segment 132 has a double-layer structure. As illustrated in the circle 1 of FIG. 8, the wall of the tubular segment 132 has an outer layer 141 and an inner layer 142. The outer layer 141 is adjacent to the void 15 (outside), while the inner layer 142 is adjacent to the refrigerant 16 (inside).

The outer layer 141 and the inner layer 142 each contain an FRP. The fibers in the FRP are glass fibers or alumina fibers.

The fibers in the outer layer 141 and the inner layer 142 are each wound in a helix around the direction of extension of the central axis of the tubular segment 132. The angles of the fibers from the direction of extension of the central axis of the tubular segment 132 may be different or identical between the outer layer 141 and the inner layer 142. The angle of the fibers in the inner layer 142 from the direction of extension of the central axis is preferably larger than the angle of the fibers in the outer layer 141, in terms of enhancing the rigidity of the tubular segment 132, and in terms of improving the workability (readiness of extraction from a mold).

The fibers in the outer layer 141 are preferably glass fibers, in terms of ensuring the rigidity of the tubular segment 132, in terms of delaying heat conduction from the outside via the refrigerant inlet tube 12 to the entire inner container 11, and in terms of reducing costs. The fibers in the inner layer 142 are preferably alumina fibers.

The inner layer 142 preferably has the same thickness as the outer layer 141, or a thickness larger than the outer layer 141. The ratio of the thickness of the inner layer 142 to the thickness of the outer layer 141 is 50:50 to 80:20, preferably 50:50 to 70:30, and more preferably 50:50 to 60:40.

The resin in the outer layer 141 is preferably the same as the resin in the inner layer 142, in terms of avoiding separation of the layers.

In the case where the FRP in the tubular segment 132 has a double-layer structure, the FRPs in the ceiling segment 131 and the bottom segment 133 preferably also have a double-layer structure, in terms of delaying heat conduction from the outside via the refrigerant inlet tube 12 to the entire inner container 11. The fibers in the outer layer 141 are preferably glass fibers, and the fibers in the inner layer 142 are preferably alumina fibers. The inner layer 142 preferably has the same thickness as the outer layer 141, or a thickness larger than the outer layer 141.

The method of fabricating the double-layer structure is described below within the description of the method of fabricating the first tubular container 13.

The following description is directed to methods of fabricating the refrigerant inlet tube 12, the first tubular container 13, the second tubular container 22, and the outer container 14.

Method of Fabricating the Refrigerant Inlet Tube 12

The method of fabricating the refrigerant inlet tube 12 involves a forming step of winding fibers impregnated with a liquid resin around a rod mold in a helix and thus forming the shape of the refrigerant inlet tube 12, a curing step of heating and curing the resin, and a demolding step of extracting the cured refrigerant inlet tube 12 from the mold, for example.

In the forming step, a typical example of the method of forming the refrigerant inlet tube 12 is a filament winding method. The angle of the fibers wound around the mold is 50° to 89° from the direction of extension of the central axis of the mold.

In the curing step, the temperature and the period for curing of the resin can be appropriately determined depending on a type and an amount of the resin. In an exemplary case where the applied resin is an epoxy resin composition and the resin amount is 20 to 50 wt %, the temperature is determined to be 80° C. to 150° C. and the period is determined to be 1 to 12 hours.

In the demolding step, the refrigerant inlet tube 12 is allowed to cool to room temperature and then extracted from the mold. This process can yield the refrigerant inlet tube 12.

Method of Fabricating the First Tubular Container 13

The description is then directed to the method of fabricating the first tubular container 13. The tubular segment 132 of the first tubular container 13 can be fabricated by the same method as the above-described method of fabricating the refrigerant inlet tube 12. The ceiling segment 131 and the bottom segment 133 of the first tubular container 13 can each be fabricated by stacking multiple prepregs made of woven fabrics impregnated with a resin, curing the prepregs, and cutting the resultant into a predetermined size. The prepregs indicate composite materials which are made of woven fabrics impregnated with a resin and in which the resin is cured in the B-stage. A resin in the B-stage is not completely cured. The prepregs may be made of unidirectional fiber sheets or fibers impregnated with a resin, instead of woven fabrics.

The description is then directed to a method of joining the tubular segment 132 to the ceiling segment 131 and the bottom segment 133.

The joining method can be achieved by, for example, providing threads to the joint portions of the ceiling segment 131 and the tubular segment 132 and the joint portions of the bottom segment 133 and the tubular segment 132, although this example is not to be taken in a limiting sense. The joint portions can be certainly sealed by applying an adhesive curable at ordinary temperature to the threads before screwing the threads together, for example.

Another method of fabricating the first tubular container 13 involves a prepreg fabricating step of impregnating woven fabrics with a resin, heating the woven fabrics, and thus fabricating prepregs, a forming step of attaching prepregs on the surface of a mold for defining the shape of the first tubular container 13 and thus forming the prepregs, a curing step of curing the prepregs by heat and pressure, and a demolding step of extracting the cured prepregs from the mold, for example.

In the prepreg fabricating step, the period of impregnation of the woven fabrics with the resin and the temperature of the resin during impregnation can be appropriately determined depending on conditions, such as a type of the resin and an amount of the adhering resin (resin amount). In an exemplary case where the applied resin is an epoxy resin composition and the resin amount is 20 to 50 wt %, the temperature is determined to be 80° C. to 150° C. and the period is determined to be 1 to 12 hours.

In the forming step, the fabricated prepregs are cut into a predetermined size. In the case where the mold has a complicated shape, the prepregs are cut into small segments. This process can allow the prepregs to follow the complicated shape.

In the curing step, a typical example of the method of curing the formed prepregs is an autoclave molding method using a high-pressure furnace. This step can achieve uniform curing of the prepregs.

In the demolding step, the cured prepregs are allowed to cool to room temperature, and then extracted from the mold. This process can yield the first tubular container 13.

In the case where the tubular segment 132 is made of a double-layer FRP, the double-layer tubular segment 132 can be fabricated by a filament winding method.

In an exemplary case where the inner layer contains alumina fibers and the outer layer contains glass fibers, the tubular segment 132 is fabricated as follows. First, alumina fibers impregnated with a resin are wound in a helix around a rod mold. Then, glass fibers impregnated with a resin are wound in a helix over the wounded alumina fibers. These steps can form the shape of the tubular segment 132. The resultant is then heated to cure the resin. The resultant is then allowed to cool to room temperature and then extracted from the mold, thereby providing the double-layer tubular segment 132.

The above-described method of fabricating the ceiling segment 131 and the bottom segment 133, the method of joining the ceiling segment 131 to the tubular segment 132, and the method of joining the bottom segment 133 to the tubular segment 132 can also be applied as the method of fabricating the ceiling segment 131 and the bottom segment 133, the method of joining the ceiling segment 131 to the tubular segment 132, and the method of joining the bottom segment 133 to the tubular segment 132 in the case of the tubular segment 132 made of a double-layer FRP.

The ceiling segment 131 and the bottom segment 133 preferably also have a double-layer structure including a layer containing alumina fibers and a layer containing glass fibers. In this case, the ceiling segment 131 and the bottom segment 133 are fabricated using prepregs made of woven fabrics prepared by weaving alumina fibers and prepregs made of woven fabrics prepared by weaving glass fibers.

Method of Fabricating the Second Tubular Container 22

The description is then directed to the method of fabricating the second tubular container 22. The method of fabricating the second tubular container 22 involves a prepreg fabricating step of fabricating cloth prepregs containing woven fabrics as a base material and UD prepregs containing unidirectional fiber sheets as a base material, a cloth prepreg forming step of attaching the cloth prepreg on the surface of a mold for defining the shape of the tubular segment 122 such that the direction of warps or wefts is orthogonal to the direction of extension of the central axis of the mold and thus forming the shape of the cloth prepreg, a UD prepreg forming step of attaching the UD prepreg on the formed cloth prepreg such that the direction of the fibers of the unidirectional fiber sheet is orthogonal to the direction of extension of the central axis of the mold and thus forming the shape of the UD prepreg, a second cloth prepreg forming step of attaching the cloth prepreg on the stacked prepregs such that the direction of warps or wefts of the woven fabric is orthogonal to the direction of extension of the central axis of the mold and thus forming the shape of the cloth prepreg, a curing step of curing the stacked prepregs by heat and pressure, and a demolding step of extracting the cured prepregs from the mold, for example.

In the prepreg fabricating step, the period of impregnation of the woven fabrics or the unidirectional fiber sheets with the resin and the temperature of the resin during impregnation can be appropriately determined depending on conditions, such as a type of the resin and an amount of the adhering resin (resin amount). In an exemplary case where the applied resin is an epoxy resin composition and the resin amount is 20 to 50 wt %, the temperature is determined to be 80° C. to 150° C. and the period is determined to be 1 to 12 hours.

In the cloth prepreg forming step, the fabricated cloth prepreg is cut into a predetermined size. The cloth prepreg is attached such that the direction of warps or wefts of the cloth prepreg is orthogonal to the direction of extension of the central axis of the mold.

In the UD prepreg forming step, the fabricated UD prepreg is attached on the formed cloth prepreg such that the direction of the fibers of the unidirectional fiber sheet is orthogonal to the direction of extension of the central axis of the mold. The area of the UD prepreg attached on the cloth prepreg is preferably at least the area corresponding to the predetermined area of the tubular segment 122. Alternatively, the UD prepreg may be attached on the entire tubular segment 122 in terms of enhancing the rigidity of the tubular segment 122.

In the second cloth prepreg forming step, the cloth prepreg cut into a predetermined size is attached on the surface of the previously attached prepregs such that the direction of warps or wefts is orthogonal to the direction of extension of the central axis of the mold.

In the curing step, a typical example of the method of curing the formed prepregs is an autoclave molding method using a high-pressure furnace. This step can achieve uniform curing of the prepregs.

In the demolding step, the cured prepregs are allowed to cool to room temperature, and then extracted from the mold. This process can yield the tubular segment 122.

The bottom segment 123 can be fabricated by stacking multiple prepregs made of woven fabrics impregnated with a resin, curing the prepregs, and cutting the resultant into a predetermined size. The bottom segment 123 can be joined to the tubular segment 122 by providing threads to the joint portions of the bottom segment 123 and the tubular segment 122 and screwing the threads together. The joint portions can be certainly sealed by applying an adhesive curable at ordinary temperature to the threads before screwing the threads together, for example.

Method of Fabricating the Outer Container 14

The description of the method of fabricating the outer container 14 is directed to the method of fabricating the outer container 14 surrounding the second tubular container 22, and the method of fabricating the outer container 14 surrounding the other portions of the inner container 11, separately.

The method of fabricating the outer container 14 surrounding the second tubular container 22 involves a prepreg fabricating step of fabricating cloth prepregs containing woven fabrics as a base material and UD prepregs containing unidirectional fiber sheets as a base material, a cloth prepreg forming step of attaching the cloth prepreg on the surface of a mold for defining the shape of the outer container 14 surrounding the second tubular container 22 such that the direction of warps or wefts is parallel to the direction of extension of the central axis of the mold and thus forming the shape of the cloth prepreg, a UD prepreg forming step of attaching the UD prepreg on the formed cloth prepreg such that the direction of the fibers of the unidirectional fiber sheet is parallel to the direction of extension of the central axis of the mold and thus forming the shape of the UD prepreg, a second cloth prepreg forming step of attaching the cloth prepreg on the stacked prepregs such that the direction of warps or wefts is parallel to the direction of extension of the central axis of the mold and thus forming the shape of the cloth prepreg, a curing step of curing the stacked prepregs by heat and pressure, and a demolding step of extracting the cured prepregs from the mold.

In the prepreg fabricating step, the period of impregnation of the woven fabrics or the unidirectional fiber sheets with the resin and the temperature of the resin can be appropriately determined depending on conditions, such as a type of the resin and an amount of the adhering resin (resin amount). In an exemplary case where the applied resin is an epoxy resin composition and the resin amount is 20 to 50 wt %, the temperature is determined to be 80° C. to 150° C. and the period is determined to be 1 to 12 hours.

In the cloth prepreg forming step, the fabricated cloth prepreg is cut into a predetermined size. The cloth prepreg is attached such that the direction of warps or wefts is parallel to the direction of extension of the central axis of the mold.

In the UD prepreg forming step, the fabricated UD prepreg is attached on the cloth prepreg such that the direction of the fibers of the unidirectional fiber sheet is parallel to the direction of extension of the central axis of the mold. The area of the UD prepreg attached on the cloth prepreg is preferably at least the area corresponding to the predetermined area of the outer container 14. Alternatively, the UD prepreg may be attached on the entire outer container 14 in terms of enhancing the rigidity of the outer container 14.

In the second cloth prepreg forming step, the cloth prepreg cut into a predetermined size is attached on the surface of the previously attached prepregs such that the direction of warps or wefts is parallel to the direction of extension of the central axis of the mold.

In the curing step, a typical example of the method of curing the formed prepregs is an autoclave molding method using a high-pressure furnace. This step can achieve uniform curing of the prepregs.

In the demolding step, the cured prepregs are allowed to cool to room temperature, and then extracted from the mold. This process can yield the outer container 14.

The outer container 14 surrounding the bottom segment 123 via the void 15 can be fabricated by stacking multiple prepregs made of woven fabrics impregnated with a resin, curing the prepregs, and cutting the resultant into a predetermined size. The outer container 14 surrounding the bottom segment 123 via the void 15 is joined to the outer container 14 surrounding the second tubular container 22 by providing threads to the joint portions and screwing the threads together. The joint portions can be certainly sealed by applying an adhesive curable at ordinary temperature to the threads before screwing the threads together, for example.

The method of fabricating the outer container 14 surrounding the portions of the inner container 11 other than the second tubular container 22 and the bottom segment 123 via the void 15 involves a prepreg fabricating step of impregnating woven fabrics with a resin, heating the woven fabrics, and thus fabricating prepregs, a prepreg forming step of attaching the prepregs on the surface of a mold for defining the shape of the outer container 14 surrounding the portions of the inner container 11 other than the second tubular container 22 and the bottom segment 123 via the void 15 and thus forming the shape of the prepregs, a curing step of curing the prepregs by heat and pressure, and a demolding step of extracting the cured prepregs from the mold.

In the prepreg fabricating step, the period of impregnation of the woven fabrics with the resin and the temperature of the resin during impregnation can be appropriately determined depending on conditions, such as a type of the resin and an amount of the resin (resin amount) adhering to the woven fabrics. In an exemplary case where the applied resin is an epoxy resin composition and the resin amount is 20 to 50 wt %, the temperature is determined to be 80° C. to 160° C. and the period is determined to be 1 to 12 hours.

In the prepreg forming step, the fabricated prepregs are cut into a predetermined size.

In the curing step, a typical example of the method of curing the formed prepregs is an autoclave molding method using a high-pressure furnace. This step can achieve uniform curing of the prepregs.

In the demolding step, the cured prepregs are allowed to cool to room temperature, and then extracted from the mold. This process can yield the outer container 14 surrounding the portions of the inner container 11 other than the second tubular container 22 and the bottom segment 123 via the void 15.

The outer container 14 surrounding the bottom segment 123, the outer container 14 surrounding the second tubular container 22, and the outer container 14 surrounding the other portions of the inner container 11 are joined to each other by providing threads to the joint portions and screwing the threads together, for example. The joint portions can be certainly sealed by applying an adhesive curable at ordinary temperature to the threads before screwing the threads together, for example.

Exemplary Application 1

The thermally insulated container 10 according to Embodiment 1 is typically applied to a magnetospinograph 60, for example.

Figure 9:
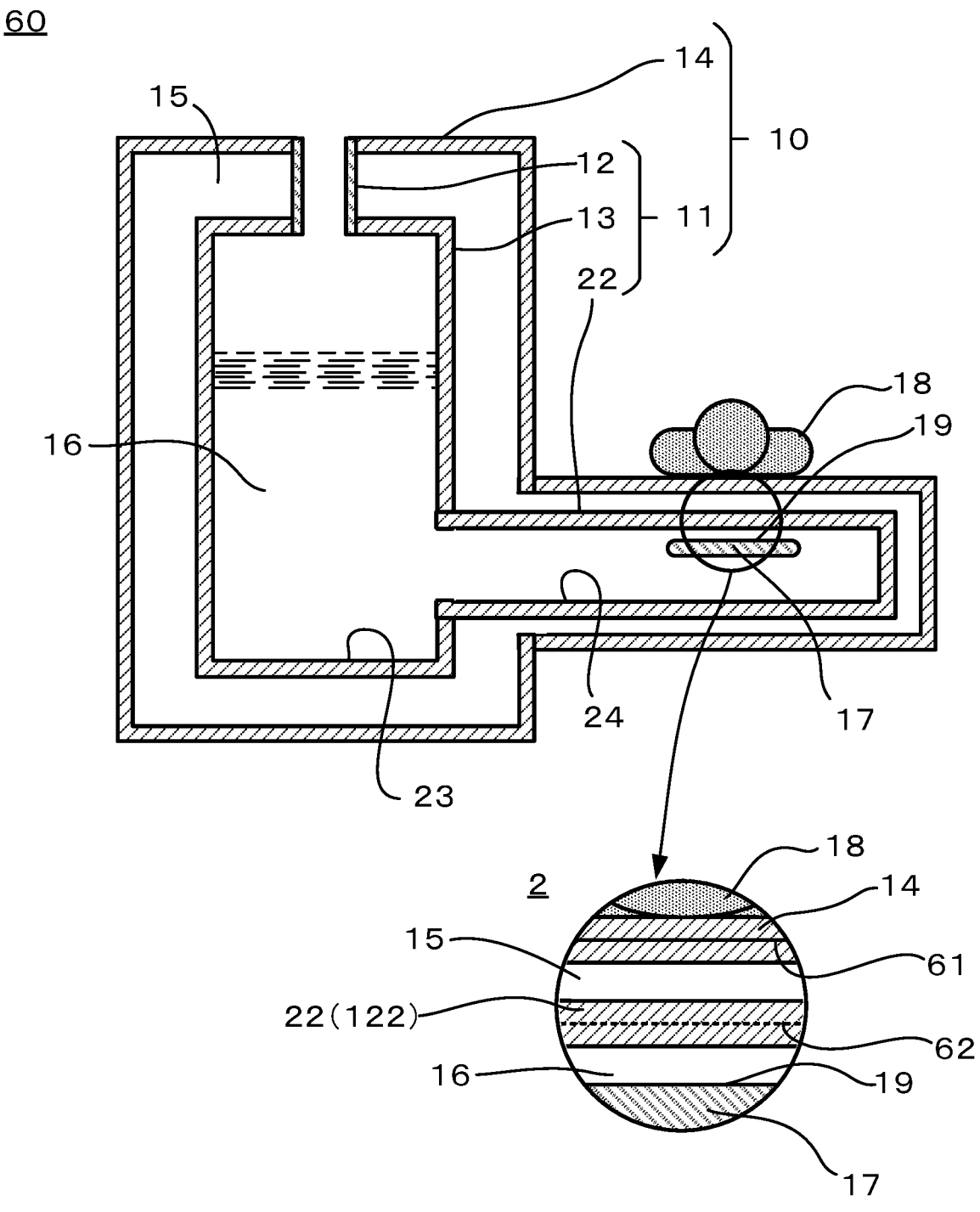
FIG. 9 is a schematic sectional view of a magnetospinograph including the thermally insulated container according to one embodiment of the present disclosure.

As illustrated in FIG. 9, the magnetospinograph 60 includes a superconducting quantum interference device 17 to detect magnetic fields generated from a living body 18, and the thermally insulated container 10. The thermally insulated container 10 includes the inner container 11, and the outer container 14 surrounding the inner container 11 via the void 15. The inner container 11 includes the first tubular container 13 having the internal accommodation space 23 for reserving the refrigerant 16, the refrigerant inlet tube 12 fixed to the first tubular container 13, and the second tubular container 22 having the internal accommodation space 24 for reserving the refrigerant 16. The superconducting quantum interference device 17 is accommodated in the second tubular container 22 while being immersed in the refrigerant 16 reserved in the second tubular container 22. As illustrated in FIG. 9, the living body 18 lies such that the spinal cord of the living body 18 is located above a measurement surface 19 of the superconducting quantum interference device 17.

As illustrated in the enlarged view in the circle 2 of FIG. 9, the measurement surface 19 is opposed to a unidirectional fiber sheet 61 in the predetermined area of the outer container 14, and is opposed to a unidirectional fiber sheet 62 in the predetermined area of the second tubular container 22 (tubular segment 122). The direction of the fibers of the unidirectional fiber sheet 61 is parallel to the direction of extension of the central axis of the second tubular container 22. The direction of the fibers of the unidirectional fiber sheet 62 is orthogonal to the direction of extension of the central axis of the second tubular container 22.

Effects

The thermally insulated container 10 and the magnetospinograph 60 including the thermally insulated container 10 according to Embodiment 1 described above can bring about the following effects.

Since the fibers of the unidirectional fiber sheet 61 are arranged to be parallel to the direction of extension of the central axis of the second tubular container 22, the structure can support the load of the living body 18 when the spinal cord of the living body 18 is located on the predetermined area of the outer container 14. In addition, since the fibers of the unidirectional fiber sheet 62 are arranged to be orthogonal to the direction of extension of the central axis of the second tubular container 22, the predetermined area of the second tubular container 22 has sufficient rigidity to resist the internal pressure caused by evacuation of the void 15.

Since the predetermined area of the second tubular container 22 and the predetermined area of the outer container 14 have the above-described structures, the thermally insulated container 10 has high rigidity. This configuration can achieve relatively thin walls. That is, the magnetospinograph 60 including the thermally insulated container 10 can achieve a reduced distance (lift-off) from the measurement surface 19 to the spinal cord (measurement target site) of the living body 18.

Furthermore, the thermally insulated container 10 provided with the refrigerant inlet tube 12 can delay heat conduction from the outside via the refrigerant inlet tube 12 to the inner container 11. The thermally insulated container 10 is thus able to reserve a refrigerant for a long period.

EXAMPLES

In order to evaluate the rigidity of the thermally insulated container 10, strengths and elastic moduli were measured in the examples and the comparative examples listed below. These examples are not intended to limit the scope of the present disclosure.

The resins and the base materials used in the examples and the comparative examples are as follows.

Resins (1) Matrix resin A
(1-1) Base resin: bisphenol A epoxy resin (DER383LCL, manufactured by The Dow Chemical Company)

(1-2) Curing agent: acid anhydride curing agent (HN-2000, manufactured by Hitachi Chemical Co., Ltd.)

(1-3) Curing accelerator: N, N-dimethylbenzylamine (Ka-olizer No. 20, manufactured by Kao Corporation)

(2) Matrix resin B (2-1) Base resin: bisphenol A epoxy resin (EPICLON850, manufactured by DIC Corporation)

(2-2) Curing agent: amine curing agent (DICY, manufactured by Nippon Carbide Industries Co., Inc.)

(2-3) Curing accelerator: N, N-dimethylbenzylamine (Ka-olizer No. 20, manufactured by Kao Corporation)

Base Materials (1) Glass cloths (K7628, manufactured by Arisawa Fiber Glass Co., Ltd.)

(2) Unidirectional fiber sheets containing alumina fibers (ECC181, manufactured by Arisawa Fiber Glass Co., Ltd.)

Resins to be impregnated in the base materials were prepared.

(1) Preparation of Resins (1-1) Preparation of a Resin to be Applied to Prepregs Containing Woven Fabrics as a Base Material The base resin, the curing agent, and the curing accelerator of the matrix resin A were used. First, 100 parts by weight of the base resin, 88 parts by weight of the curing agent, and 0.8 parts by weight of the curing accelerator were added to a vessel. The mixture was then stirred with a high-speed mixer at room temperature at a rate of 700 rpm for 60 minutes, thereby yielding the matrix resin A. The resulting viscosity was 500 mPa s.

(1-2) Preparation of a Resin to be Applied to Prepregs Containing Unidirectional Fiber Sheets as a Base Material The base resin, the curing agent, and the curing accelerator of the matrix resin B were used. First, 100 parts by weight of the base resin, 88 parts by weight of the curing agent, and 0.8 parts by weight of the curing accelerator were added to a vessel. The mixture was then stirred with a high-speed mixer at room temperature at a rate of 700 rpm for 60 minutes, thereby yielding the matrix resin B. The resulting viscosity was 500 mPa s.

Prepregs were fabricated using the prepared resins.

(2) Fabrication of Prepregs (2-1) Fabrication of Cloth Prepregs Containing Woven Fabrics (Glass Cloths) as a Base Material The glass cloths were impregnated with the matrix resin A so as to achieve a resin amount of 35 wt % after curing. The glass cloths were then dried at a temperature of 130° C. for ten minutes, thereby yielding prepregs cured in the B-stage having a resin amount of 35 wt %.

(2-2) Fabrication of Cloth Prepregs Containing Woven Fabrics (Glass Cloths) as a Base Material and Having Different Resin Amounts In order to fabricate prepregs having resin amounts of 13, 15, 18, 40, 50, and 60 wt % after curing, the glass cloths were impregnated with the corresponding amounts of the matrix resin A. The glass cloths after impregnation were then dried at a temperature of 130° C. for ten minutes, thereby yielding prepregs cured in the B-stage having resin amounts of 13, 15, 18, 40, 50, and 60 wt %.

(2-3) Fabrication of UD Prepregs Containing Unidirectional Fiber Sheets (UD Sheets) as a Base Material The UD sheets were impregnated with the matrix resin B so as to achieve a resin amount of 35 wt % after curing. The UD sheets were then dried at a temperature of 130° C. for ten minutes, thereby yielding UD prepregs cured in the B-stage having a resin amount of 35 wt %.

The following description is directed to a method of fabricating measurement samples and methods of measurement and evaluation in the examples and the comparative examples.

(3) Fabrication of Measurement Samples (3-1) Fabrication of Measurement Samples Having Different Stacking Structures and the Identical Resin Amount First, the prepregs fabricated as described in (2-1) and (2-3) were stacked on each other in accordance with the individual stacking structures of Examples 1 to 6 and Comparative Examples 1 and 2 illustrated in Tables 1 and 2. Each of the cloth prepregs was stacked such that the warps formed an angle of 0° from any one reference side of the prepreg. Each of the UD prepregs was stacked such that the aligned fibers formed a predetermined angle from the one reference side. The predetermined angle was 0° in Examples 1 to 3, and was 90° in Examples 4 to 6. The stacked prepregs were pressed at a temperature of 130° C. at a pressure of 0.29 MPa for 90 minutes, so as to achieve a resin amount of 35 wt % after curing and a thickness of 2.5 mm after curing. This pressing step produced samples cured in the C-stage.

The resulting samples in Examples 1 to 6 were cut so as to have a rectangular shape having a width of 10 mm and a length of 20 mm and make the direction of alignment of the fibers of the UD prepregs parallel to the lengthwise direction, thereby yielding measurement samples in Examples 1 to 6. The resulting samples in Comparative Examples 1 and 2 were cut so as to have a rectangular shape having a width of 10 mm and a length of 20 mm and make the direction of the warps of the woven fabrics parallel to the lengthwise direction, thereby yielding measurement samples in Comparative Examples 1 and 2. In the measurement samples in Examples 4 to 6, the direction of alignment of the fibers of the UD prepregs was made parallel to the lengthwise direction of the measurement samples, for the purpose of evaluation of the difference in effects (rigidities) caused by different directions of alignment of the fibers when the unidirectional fiber sheets are applied to the thermally insulated container (specifically, the inner container).

(3-2) Fabrication of Measurement Samples Having the Identical Stacking Structure and Different Resin Amounts The prepregs adjusted to have the predetermined resin amounts described in (2-2) were stacked on each other, so as to achieve the individual resin amounts of Examples 7 to 10 and Comparative Examples 3 and 4 illustrated in Table 3 and achieve a thickness of 2.5 mm after curing. Each of the prepregs was stacked such that the warps were parallel to any one reference side of the prepreg. The stacked prepregs were pressed at a temperature of 130° C. at a pressure of 0.29 MPa for 90 minutes, thereby producing samples cured in the C-stage and having different resin amounts. The resulting samples were cut so as to have a rectangular shape having a width of 10 mm and a length of 20 mm and make the direction of the warps of the woven fabrics parallel to the lengthwise direction, thereby yielding measurement samples.

(4) Measurement of Bending Strengths and Bending Elastic Moduli

The bending strengths and the bending elastic moduli of the measurement samples were measured with an autograph tester (AG-10, manufactured by Shimadzu Corporation) by a three-point bending test (distance between supports of 10 mm, testing rate of 2 mm/min). Before measurement, a measurement sample was installed in the tester such that both supports of the three-point bending test were located at both ends of the measurement sample in its longitudinal direction. The bending strengths and the bending elastic moduli were calculated from the resulting maximum bending stresses (breaking load) in accordance with JIS K7017.

Tables 1 and 2 illustrate results of measurement of the bending strengths and the bending elastic moduli in Examples 1 to 6 and Comparative Examples 1 and 2. Table 3 illustrates results of measurement of the bending strengths and the bending elastic moduli in Examples 7 to 10 and Comparative Examples 3 and 4 characterized in different resin amounts.

TABLE 1

| ITEM | EXAMPLE 1 | EXAMPLE 2 | EXAMPLE 3 | COMPARATIVE EXAMPLE 1 |
|---|---|---|---|---|
| STACKING STRUCTURE [1]: TYPE OF BASE MATERIAL (TYPE OF FIBERS) ANGLE | WOVEN FABRIC (GLASS) 0° | UD (ALUMINA) 0° | UD (ALUMINA) 0° | WOVEN FABRIC (GLASS) 0° |
| | WOVEN FABRIC (GLASS) 0° | UD (ALUMINA) 0° | WOVEN FABRIC (GLASS) 0° | WOVEN FABRIC (GLASS) 0° |
| | WOVEN FABRIC (GLASS) 0° | WOVEN FABRIC (GLASS) 0° | UD (ALUMINA) 0° | WOVEN FABRIC (GLASS) 0° |
| | WOVEN FABRIC (GLASS) 0° | WOVEN FABRIC (GLASS) 0° | WOVEN FABRIC (GLASS) 0° | WOVEN FABRIC (GLASS) 0° |
| | UD (ALUMINA) 0)° | WOVEN FABRIC (GLASS) 0° | UD (ALUMINA) 0° | WOVEN FABRIC (GLASS) 0° |
| | WOVEN FABRIC (GLASS) 0° | WOVEN FABRIC (GLASS) 0° | WOVEN FABRIC (GLASS) 0° | WOVEN FABRIC (GLASS) 0° |
| | WOVEN FABRIC (GLASS) 0° | WOVEN FABRIC (GLASS) 0° | UD (ALUMINA) 0° | WOVEN FABRIC (GLASS) 0° |
| | WOVEN FABRIC (GLASS) 0° | UD (ALUMINA) 0° | WOVEN FABRIC (GLASS) 0° | WOVEN FABRIC (GLASS) 0° |
| | WOVEN FABRIC (GLASS) 0° | UD (ALUMINA) 0° | UD (ALUMINA) 0° | WOVEN FABRIC (GLASS) 0° |
| BENDING STRENGTH (MPa) | 710 | 750 | 814 | 585 |
| BENDING ELASTIC MODULUS (GPa) | 30 | 49 | 43 | 22 |

[1] The stacking structure indicates a structure of the layers of the base material, and UD indicates a unidirectional fiber sheet.

TABLE 2

| ITEM | EXAMPLE 4 | EXAMPLE 5 | EXAMPLE 6 | COMPARATIVE EXAMPLE 2 |
|---|---|---|---|---|
| STACKING STRUCTURE (1): TYPE OF BASE MATERIAL (TYPE OF FIBERS) ANGLE | WOVEN FABRIC (GLASS) 0° | UD (ALUMINA) 90° | UD (ALUMINA) 90° | WOVEN FABRIC (GLASS) 0° |
| | WOVEN FABRIC (GLASS) 0° | UD (ALUMINA) 90° | WOVEN FABRIC (GLASS) 0° | WOVEN FABRIC (GLASS) 0° |
| | WOVEN FABRIC (GLASS) 0° | WOVEN FABRIC (GLASS) 0° | UD (ALUMINA) 90° | WOVEN FABRIC (GLASS) 0° |
| | WOVEN FABRIC (GLASS) 0° | WOVEN FABRIC (GLASS) 0° | WOVEN FABRIC (GLASS) 0° | WOVEN FABRIC (GLASS) 0° |
| | UD (ALUMINA) 90° | WOVEN FABRIC (GLASS) 0° | UD (ALUMINA) 90° | WOVEN FABRIC (GLASS) 0° |
| | WOVEN FABRIC (GLASS) 0° | WOVEN FABRIC (GLASS) 0° | WOVEN FABRIC (GLASS) 0° | WOVEN FABRIC (GLASS) 0° |
| | WOVEN FABRIC (GLASS) 0° | WOVEN FABRIC (GLASS) 0° | UD (ALUMINA) 90° | WOVEN FABRIC (GLASS) 0° |
| | WOVEN FABRIC (GLASS) 0° | UD (ALUMINA) 90° | WOVEN FABRIC (GLASS) 0° | WOVEN FABRIC (GLASS) 0)° |
| | WOVEN FABRIC (GLASS) 0° | UD (ALUMINA) 90° | UD (ALUMINA) 90° | WOVEN FABRIC (GLASS) 0° |
| BENDING STRENGTH (MPa) | 710 | 750 | 814 | 585 |
| BENDING ELASTIC MODULUS (GPa) | 30 | 49 | 43 | 22 |

(1) The stacking structure indicates a structure of the layers of the base material, and UD indicates a unidirectional fiber sheet.

TABLE 3

| ITEM | EXAMPLE 7 | EXAMPLE 8 | EXAMPLE 9 | EXAMPLE 10 | COMPARATIVE EXAMPLE 3 | COMPARATIVE EXAMPLE 4 |
|---|---|---|---|---|---|---|
| RESIN AMOUNT (wt %) | 15 | 18 | 40 | 50 | 13 | 60 |
| BENDING STRENGTH (MPa) | 480 | 490 | 510 | 398 | 350 | 298 |
| BENDING ELASTIC MODULUS (GPa) | 27 | 25 | 23 | 22 | 18 | 11 |

Comparison between the examples and the comparative example illustrated in Table 1 revealed that the bending strength in Example 1 was approximately 1.2 times as high as that in Comparative Example 1 on the assumption that the samples had the same thickness. The bending strength in Example 3 was found to be approximately 1.4 times as high as that in Comparative Example 1. The bending elastic modulus in Example 1 was found to be approximately 1.4 times as high as that in Comparative Example 1. The bending elastic modulus in Example 2 was found to be approximately 2.2 times as high as that in Comparative Example 1.

Comparison between the examples and the comparative example illustrated in Table 2 revealed that the bending strength in Example 4 was approximately 1.2 times as high as that in Comparative Example 2 on the assumption that the samples had the same thickness. The bending strength in Example 6 was found to be approximately 1.4 times as high as that in Comparative Example 2. The bending elastic modulus in Example 4 was found to be approximately 1.4 times as high as that in Comparative Example 2. The bending elastic modulus in Example 5 was found to be approximately 2.2 times as high as that in Comparative Example 2.

Comparison between Examples 7 to 10 and Comparative Example 4 illustrated in Table 3 revealed that the resin amount in the range of 15 to 50 wt % enhanced the bending strengths approximately 1.3 to 1.7 times. The resin amount in this range was also found to enhance the bending elastic moduli approximately 2.0 to 2.5 times.

These results imply that, for example, the structure in Comparative Example 1 must have a larger thickness in order to achieve the same rigidity as that in Example 1. That is, the structure in Example 1 can provide the thermally insulated container characterized by thin walls and high rigidity. This thermally insulated container is preferably applied to an outer container susceptible to external stresses, such as external pressure (pressure of ambient air) and loads. The structure in Comparative Example 2 also must have a larger thickness in order to achieve the same rigidity as that in Example 4. That is, the structure in Example 4 can provide the thermally insulated container characterized by thin walls and high rigidity. This thermally insulated container is preferably applied to an inner container susceptible to stresses, such as internal pressure. The results illustrated in Table 3 imply that the resin amount in the range of 15 to 50 wt % was able to enhance the strength and the elastic modulus of the thermally insulated container itself, leading to an increase in the rigidity of the thermally insulated container itself.

Accordingly, the above-described embodiment can provide a thermally insulated container characterized by thin walls and high rigidity, and a magnetospinograph including the thermally insulated container.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2021-059358, filed on Mar. 31, 2021, the entire disclosure of which is incorporated by reference herein.

REFERENCE SIGNS LIST

10 Thermally insulated container
11 Inner container
12 Refrigerant inlet tube
13 First tubular container
131 Ceiling segment
122, 132 Tubular segment
123, 133 Bottom segment
141 Outer layer
142 Inner layer
14 Outer container
15 Void
16 Refrigerant
17 Superconducting quantum interference device
18 Living body
19 Measurement surface
21 Base material
22 Second tubular container
23, 24 Accommodation space
60 Magnetospinograph
61, 62 Unidirectional fiber sheet
65 Holding yarn
66 Flat yarn

The invention claimed is:

1. A thermally insulated container, comprising:
an inner container; and
an outer container surrounding the inner container via a void, wherein
each of the inner container and the outer container includes a fiber reinforced plastic prepared by impregnating a base material including fibers with a resin,
the inner container comprises
    a first cylindrical container and a second cylindrical container each having an internal accommodation space to reserve a refrigerant, and
    a refrigerant inlet tube through which the refrigerant is introduced into the first cylindrical container,
the accommodation space of the second cylindrical container is in communication with the accommodation space of the first cylindrical container,
the base material in each of a predetermined area of the second cylindrical container and a predetermined area of the outer container includes a woven fabric and a unidirectional fiber sheet fabricated by aligning multiple fibers to one direction,
the outer container surrounds the second cylindrical container such that the unidirectional fiber sheet in the predetermined area of the second cylindrical container is opposed to the unidirectional fiber sheet in the predetermined area of the outer container; and
a superconducting quantum interference device for detecting a magnetic field generated from a living body,
wherein, the superconducting quantum interference device is accommodated in the accommodation space of the second cylindrical container while being immersed in the refrigerant reserved in the accommodation space of the second cylindrical container;
wherein a measurement surface of the superconducting quantum interference device is opposed to the predetermined area of the outer container and the predetermined area of the second cylindrical container;
wherein the predetermined area of the outer container is a region to which a load of the living body is applied during detection of the magnetic field.

2. The thermally insulated container according to claim 1, wherein a direction of the fibers of the unidirectional fiber sheet in the predetermined area of the second cylindrical container is orthogonal to a direction of extension of a central axis of the second cylindrical container.

3. The thermally insulated container according to claim 1, wherein a direction of the fibers of the unidirectional fiber sheet in the predetermined area of the outer container is parallel to a direction of extension of a central axis of the second cylindrical container.

4. The thermally insulated container according to claim 1, wherein each of the woven fabric and the unidirectional fiber sheet in the predetermined area of the second cylindrical container includes at least one selected from the group consisting of glass fibers, alumina fibers, and carbon fibers.

5. The thermally insulated container according to claim 1, wherein each of the woven fabric and the unidirectional fiber sheet in the predetermined area of the outer container includes at least one selected from the group consisting of glass fibers, alumina fibers, and carbon fibers.

6. The thermally insulated container according to claim 1, wherein the fiber reinforced plastic in the thermally insulated container has a resin amount of 15 to 50 wt % with respect to a total weight of the fiber reinforced plastic.

7. The thermally insulated container according to claim 1, wherein the resin includes an epoxy resin.

8. The thermally insulated container according to claim 1, wherein the second cylindrical container including a cylindrical portion having an axis disposed horizontally and a bottom surface portion closing one end portion of the cylindrical portion.

9. The thermally insulated container according to claim 8, wherein at least one of:

the unidirectional fiber sheet is laminated on both surfaces of the woven fabric, or the woven fabric and the unidirectional fiber sheet are alternately laminated.

10. The thermally insulated container according to claim 9, wherein at least one of:

a base material constituting a predetermined region of the outer container has a configuration in which the woven fabric is laminated on both surfaces of the unidirectional fiber sheet, the unidirectional fiber sheet is laminated on both surfaces of the woven fabric, or the woven fabric and the unidirectional fiber sheet are alternately laminated.

11. The thermally insulated container according to claim 10, wherein at least one of:

the base material constitutes the portion other than the predetermined region of the second cylindrical container and the portion other than the predetermined region of the outer container includes a woven fabric and a unidirectional fiber sheet.

12. The thermally insulated container according to claim 11, wherein the outer container surrounds the second cylindrical container in a state where the unidirectional fiber sheet constituting the predetermined region of the second cylindrical container and the unidirectional fiber sheet constituting the predetermined region of the outer container face each other, and the predetermined region of the second cylindrical container is a predetermined region of the cylindrical portion facing the measurement surface of the superconducting quantum device.

* * * * *